United States Patent
Shim

(10) Patent No.: US 7,061,848 B2
(45) Date of Patent: Jun. 13, 2006

(54) DATA REPRODUCTION APPARATUS AND METHOD WITH IMPROVED PERFORMANCE BY ADJUSTING FILTER COEFFICIENTS OF EQUALIZER

(75) Inventor: Jae-seong Shim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/835,003

(22) Filed: Apr. 30, 2004

(65) Prior Publication Data

US 2004/0202081 A1    Oct. 14, 2004

Related U.S. Application Data

(62) Division of application No. 09/704,549, filed on Nov. 3, 2000, now Pat. No. 6,747,936.

(30) Foreign Application Priority Data

Nov. 4, 1999   (KR) .................................. 99-48585

(51) Int. Cl.
   *G11B 7/00*   (2006.01)
(52) U.S. Cl. .................. 369/59.22; 369/44.35
(58) Field of Classification Search ............ 369/44.35, 369/44.34, 47.1, 47.17, 47.44, 53.32, 53.35, 369/59.22
   See application file for complete search history.

(56) References Cited

U.S. PATENT DOCUMENTS 6,477,125 B1 * 11/2002 Hayami .................... 369/59.22

FOREIGN PATENT DOCUMENTS

| JP | 06-077772 | 3/1994 |
|---|---|---|
| JP | 06-124542 | 5/1994 |
| JP | 6-124542 | 5/1994 |
| JP | 07-044869 | 2/1995 |
| JP | 7-44869 | 2/1995 |
| JP | 07-050027 | 2/1995 |
| JP | 7-50027 | 2/1995 |
| JP | 7-210888 | 8/1995 |
| JP | 07-235150 | 9/1995 |
| JP | 8-30998 | 2/1996 |
| JP | 08-030998 | 2/1996 |
| JP | 08-249829 | 9/1996 |
| JP | 8-249829 | 9/1996 |
| JP | 9-231573 | 9/1997 |
| JP | 09-259543 | 10/1997 |
| JP | 9-259543 | 10/1997 |
| JP | 9-320206 | 12/1997 |
| JP | 10-83626 | 3/1998 |
| JP | 10-083626 | 3/1998 |
| JP | 10-92119 | 4/1998 |
| JP | 10-91964 | 10/1998 |
| JP | 10-283729 | 10/1998 |
| JP | 11-273256 | 10/1999 |

* cited by examiner

*Primary Examiner*—Nabil Hindi
(74) *Attorney, Agent, or Firm*—Stein, McEwen & Bui, LLP

(57) ABSTRACT

A data reproduction apparatus for adjusting filter coefficients of an equalizer including a digital filter, and connected before a Viterbi detector and a method therefor. A level of the output value of the equalizer is detected based on a reference level set in the Viterbi detector, and a level error of the detected level with respect to a predetermined reference value is detected. The filter coefficients of the equalizer are adjusted such that the level error is minimized, thereby improving the detection performance of the Viterbi detector.

9 Claims, 20 Drawing Sheets

DATA REPRODUCTION APPARATUS AND METHOD WITH IMPROVED PERFORMANCE BY ADJUSTING FILTER COEFFICIENTS OF EQUALIZER

CROSS-REFERENCE TO RELATED APPLICATIONS

This application is a divisional application of Ser. No. 09/704,549, filed Nov. 3, 2000, now U.S. Pat. No. 6,747,936, and claims the benefit of Korean Application No. 99-48585, filed Nov. 4, 1999, in the Korean Patent Office, the disclosures of which are incorporated herein by reference.

BACKGROUND OF THE INVENTION

1. Field of the Invention

The present invention relates to the field of data reproduction, and more particularly, to a data reproduction apparatus and method with optimum performance by adjusting filter coefficients for an equalizer to minimize a level error in detecting data.

2. Description of the Related Art

As a technique for increasing recording density by signal processing without changing the characteristics of a conventional recording/reproducing apparatus, partial response maximum likelihood (PRML) related technique, including Viterbi decoding, has advanced.

Viterbi decoders have a predetermined reference level for use in detecting an error value of data. To match the level of input data of a Viterbi decoder to the predetermined reference level, filter tap coefficients of an equalizer connected in front of the Viterbi detector are adjusted to output data whose level matches the reference level of the Viterbi detector.

FIG. 1 illustrates a coefficient adaptation method of a conventional equalizer. An analog-to-digital converter (ADC) 10 samples an input radio frequency (RF) signal, and an asymmetry compensator 12 and an adder 14 correct for asymmetry or a DC offset component of the sample RF signal and provides the result to an equalizer 16. A 3T level error detector 18 detects a difference, i.e., error ($e_k$), between a reference value and the minimum pit (or mark) level, which corresponds to 3T (where T is a pit interval) in a conventional digital versatile disc (DVD) or compact disc (CD)), output from the equalizer 16 which is constituted of a finite impulse response (FIR) filter.

If the error value detected by the 3T level error detector 18 is a positive value, a filter coefficient adjuster 20 determines that the minimum pit level is larger than the reference value. In this case, the filter coefficient adjuster 20 provides the equalizer 16 with a filter coefficient $W_{k+1}$, which is adjusted to decrement a filter coefficient $K_b$ and increment a filter coefficient $K_a$, to decrease the minimum pit level output from the equalizer 16. To the contrary, if the error value detected by the 3T level error detector 18 has a negative value, the filter coefficient adjuster 20 determines that the minimum pit level is smaller than the reference value. As a result, the filter coefficient adjuster 20 provides the equalizer 16 with the filter coefficient $W_{k+1}$, which is adjusted to decrement the filter coefficient $K_a$ and increment the filter coefficient $K_b$, to increase the minimum pit level output from the equalizer 16. The minimum pit level is adjusted to an appropriate level in the above manner, so that the performance of the Viterbi detector 22 is enhanced.

FIG. 2 illustrates the structure of the equalizer 16. In FIGS. 1 and 2, $x_k$ indicates data input to the equalizer 16, $y_k$ indicates data output from the equalizer 16, and $W_{k+1}$ indicates the filter coefficient for the equalizer 16 after coefficient adaptation. Reference numerals 30, 32, 34, 36, 38, 40, 42 and 44 denote delays, reference numerals 46, 48 and 50 denote coefficient multipliers, and reference numeral 52 denotes an adder.

With the structure of the conventional equalizer, detection of the minimum pit level is difficult and level error detection is restricted because only a middle level of the minimum pit is used. Thus, it is difficult to expect a great improvement in reproduction performance. In addition, even though defocusing occurs, the coefficient adaptation in the conventional equalizer ensures the improvement of reproduction performance, by adjusting filter coefficients. However, the conventional equalizer cannot be adopted when the coefficients of the equalizer asymmetrically vary due to tangential tilting.

SUMMARY OF THE INVENTION

To solve the above problems, it is an object of the present invention to provide a data reproduction apparatus and method with improved performance, which can be adopted for a recording medium such as an optical disk.

It is a second object of the present invention to provide a data reproduction apparatus and method with improved performance, which selects filter coefficients for an equalizer such that a level error is minimized.

It is a third object of the present invention to provide a data reproduction apparatus and method with improved performance, which adaptively selects filter coefficients for an equalizer such that a level error is minimized.

If is a fourth object of the present invention to provide a data reproduction apparatus and method which monitors the servo status, such as the direction of tangential tilting, or defocusing status, according to variations in filter coefficients.

It is a fifth object of the present invention to provide a data reproduction apparatus and method with improved performance, which adaptively selects filter coefficients for an equalizer, in consideration of the servo status, such as the direction of tangential tilting, or defocusing status, according to variations in filter coefficients.

Additional objects and advantages of the invention will be set forth in part in the description which follows, and, in part, will be obvious from the description, or may be learned by practice of the invention.

According to an aspect of the present invention, there is provided a data reproduction apparatus including a data detector which detects data based on partial response maximum likelihood (PRML). The apparatus includes an equalizer comprising a digital filter. A level error detector extracts a level of the output value of the equalizer based on a reference level set in the data detector and detects a level error between the level of the output value and a predetermined reference value. A coefficient bank stores filter coefficients of the equalizer and a coefficient selector selects the filter coefficients of the equalizer from the coefficient bank such that the level error is minimized.

In another embodiment, the present invention provides a data reproduction apparatus including a data detector which detects data based on partial response maximum likelihood (PRML). The apparatus includes an equalizer comprising a digital filter. A level error detector extracts a level of the output value of the equalizer based on a reference level set in the data detector and detects a level error between the level of the output value and a predetermined reference value. A coefficient adapter adapts filter coefficients of the equalizer such that a difference between the level error and a target level error is minimized.

Preferably, the data reproduction apparatus includes a defocus/tilt detector which detects the servo status by monitoring variations of the adaptive filter coefficients of the equalizer.

According to another aspect of the present invention, there is provided a data reproduction method which improves the performance of a data detector which detects data based on partial response maximum likelihood (PRML) by adjusting filter coefficients of an equalizer comprising a digital filter, connected before the data detector. The method includes extracting a level of the output data of the equalizer based on a reference level set in the data detector, and detecting a level error between the level of the output data and a predetermined reference value; and adjusting the filter coefficients of the equalizer such that the level error is minimized.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Figure 1:
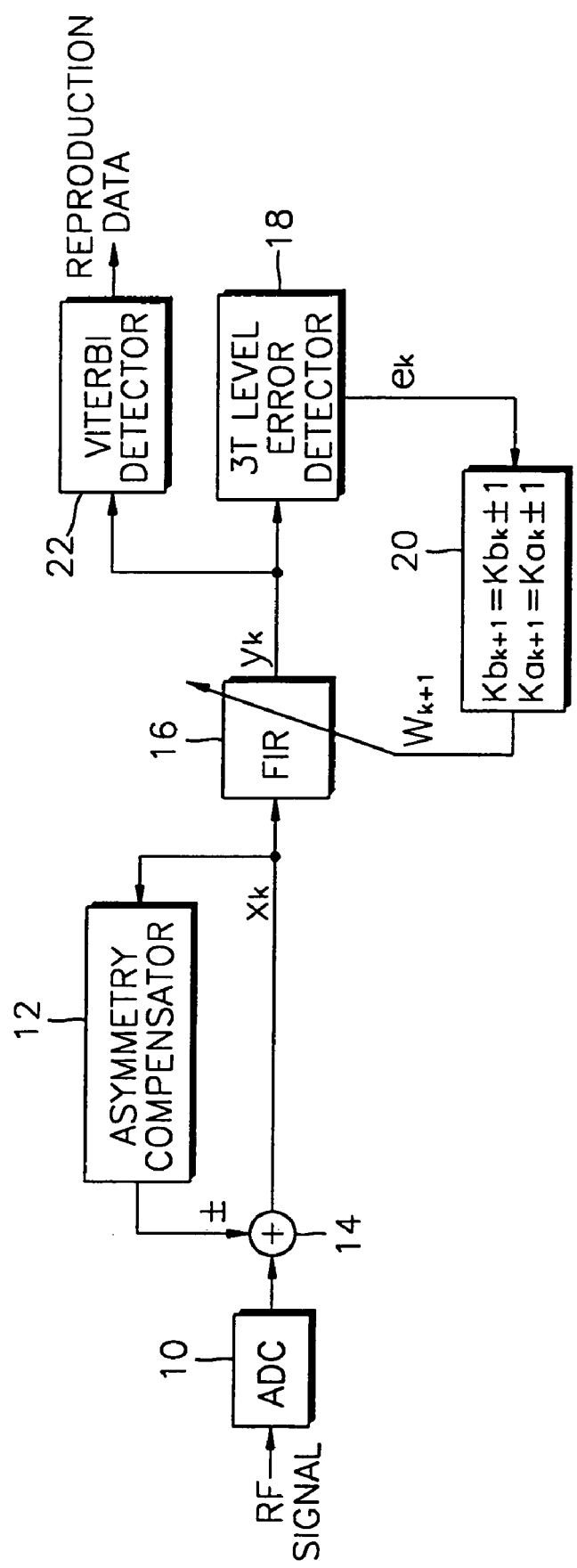
FIG. 1 illustrates a coefficient adaptation method of a conventional equalizer.
Figure 2:
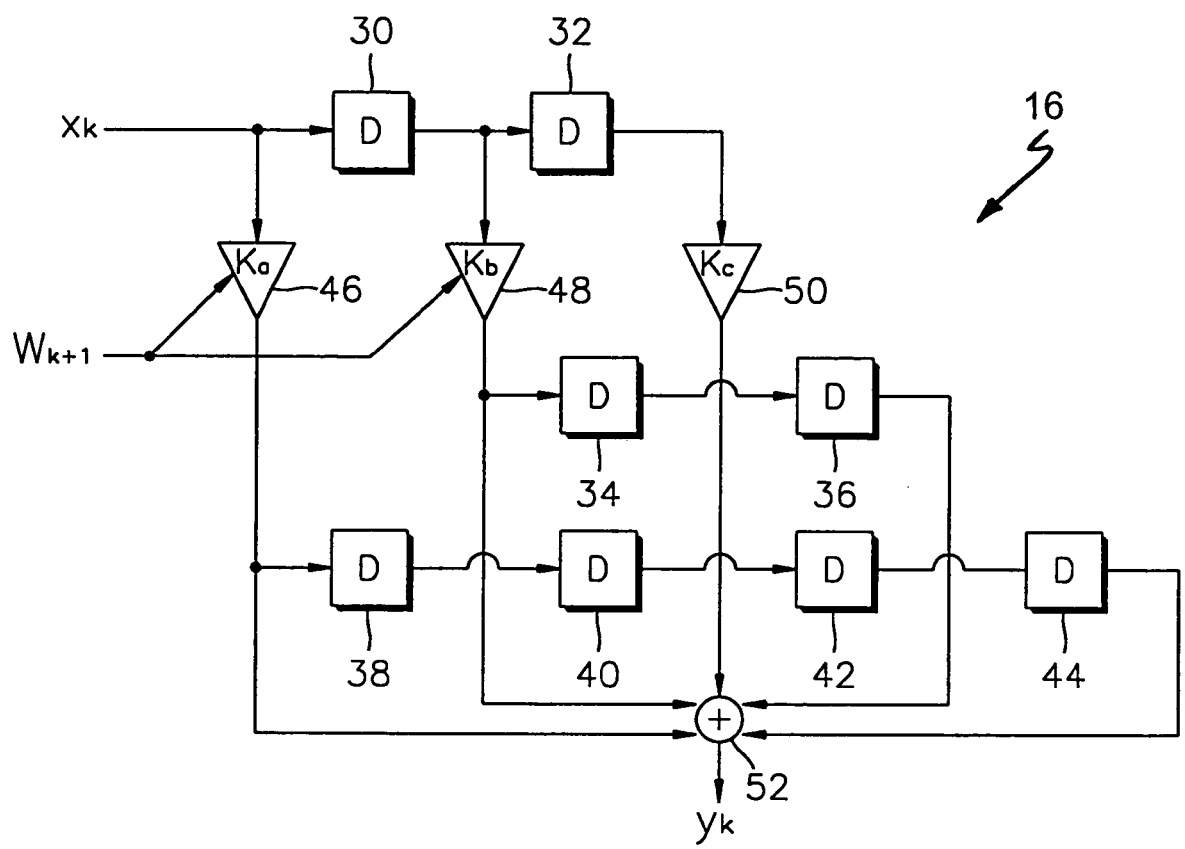
FIG. 2 illustrates the structure of the filter of the equalizer of FIG. 1.

Reference will now be made in detail to the present preferred embodiments of the present invention, examples of which are illustrated in the accompanying drawings, wherein like reference numerals refer to like elements throughout.

Figure 3:
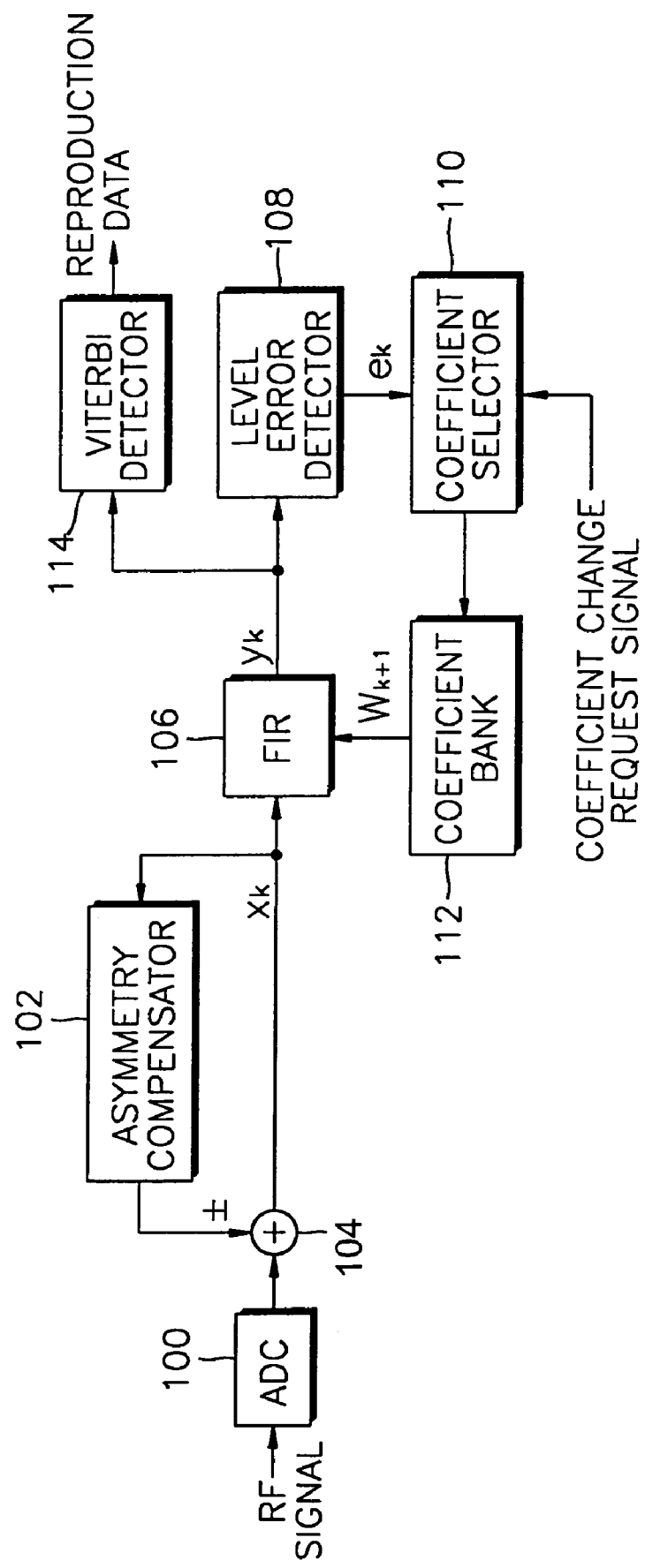
FIG. 3 is a block diagram of a preferred embodiment of a data reproduction apparatus according to the present invention.

A data reproduction apparatus according to the present invention is shown in FIG. 3. In FIG. 3, an analog-to-digital converter (ADC) 100, an asymmetry compensator 102, an adder 104, an equalizer 106 and a Viterbi detector 114 are the same as those items shown as items 10, 12, 14, 16, and 22, respectively, in FIG. 1. Thus, a description of the operation of such elements will not be repeated here. The Viterbi detector 114 is a data detector based on partial response maximum likelihood (PRML).

For example, if the Viterbi detector 114 is a PR(a,b,a) type, wherein a and b are variables used to determine the signal levels of the decoder, a level error detector 108 has predetermined reference values for positive and negative middle and maximum levels. The level error detector 108 detects positive and negative middle and maximum levels from an input signal $y_k$ by detection methods, which will be described with reference to FIGS. 4 and 5, and outputs a level error $e_k$ for each detected level with respect to the corresponding reference values. If the Viterbi decoder 114 is a PR(a,b,b,a) type, where a and b are variables used to determine the signal levels of the decoder, the level error detector 108 has predetermined reference values for positive and negative middle and maximum levels as well as zero level. The level error detector 108 detects those levels from the input signal $y_k$ by detection methods, which will be described with reference to FIGS. 5, 6 and 7, and outputs a level error $e_k$ for each detected level with respect to the corresponding reference values. A coefficient bank 112, which stores a plurality of coefficient values for the equalizer 106, outputs a coefficient value $W_{k+1}$ according to selection by a coefficient selector 110, as a filter tap coefficient value for the equalizer 106. Viterbi decoders of type PR(a,b,a) and PR(a,b,b,a) are well known in the art to which the present invention pertains. A difference between the type PR(a,b,a) and the type PR(a,b,b,a) decoders is that the type PR(a,b,b,a) decoder has a zero level and the type PR(a,b,a) decoder does not have a zero level.

When a coefficient change request signal is input from a controller (not shown) or a servo unit (not shown), the coefficient selector 110 selects coefficients stored in the coefficient bank 112, and changes the tap filter coefficients of the equalizer 106. The coefficient selector 110 checks the level error $e_k$ output from the level error detector 108 and sets the coefficient with the minimum level error as the final filter tap coefficient for the equalizer 106.

Figure 4:
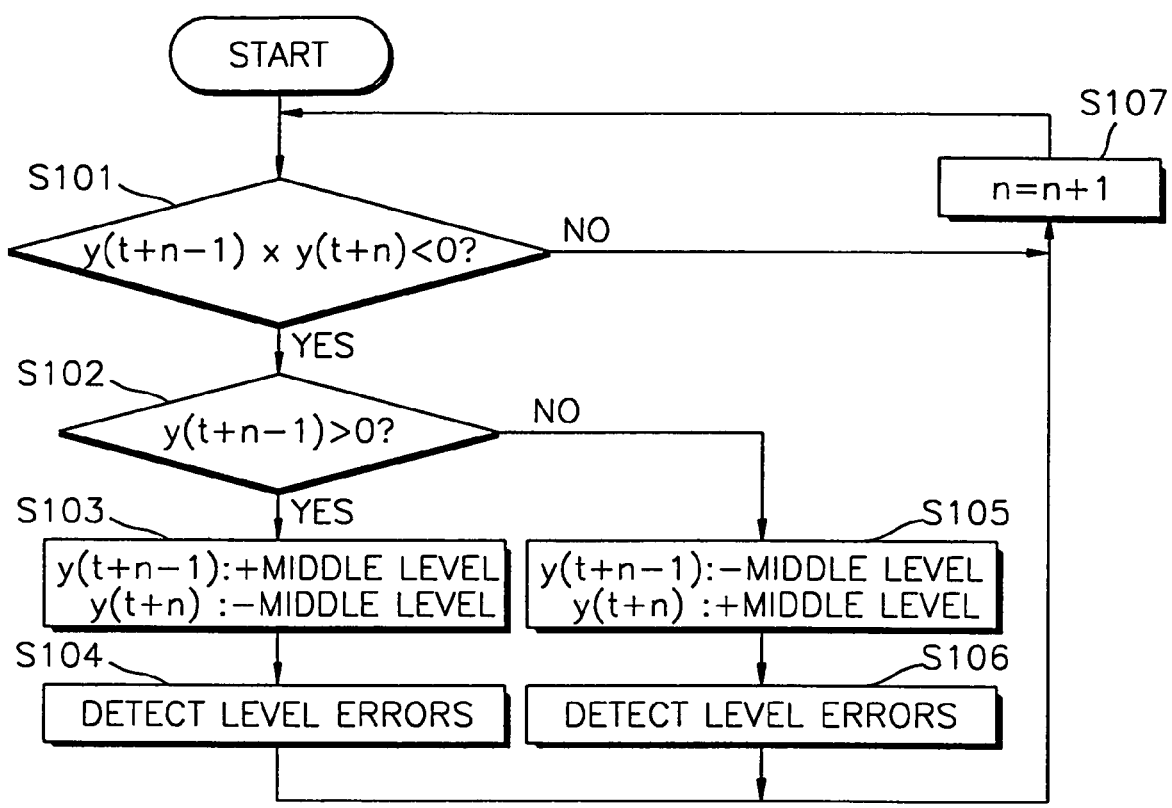
FIG. 4 is a flowchart illustrating an error detection method using the positive and negative middle levels of the output value of the equalizer when a PR (a,b,a) type Viterbi detector is adopted.

Hereinafter, a method of detecting the level error $e_k$ by the level error detector 108 with various levels extracted from the input signal $y_k$ will be described. FIG. 4 is a flowchart illustrating an embodiment of an error detection method with the positive and negative middle levels extracted from the output signal $y_k$ of the equalizer 106 when a PR(a,b,a) type Viterbi decoder is adopted.

At operation S101, it is determined whether the product of two successive sampling data y(t+n−1) and y(t+n) is less than 0. If yes, it is determined which one of the two sampling data, for example, y(t+n−1), is greater than 0 (S102). One of the sampling data, which is greater than 0, is determined to be a positive middle level, and the other sampling data which is less than 0 is determined to be a negative middle level. That is, if it is determined in operation S103 that y(t+n−1) is greater than 0, y(t+n−1) is determined as the positive middle level, and y(t+n) is determined as the negative middle level (S103). Next, a level error corresponding to a difference between the positive middle level, the value of data y(t+n−1), and a corresponding reference value, and a level error corresponding to a difference between a corresponding reference value and the negative middle level, the value of data y(t+n), are detected (S104).

If it is determined in operation S102 that the sampling data y(t+n−1) is less than 0, y(t+n−1) is determined to be a negative middle level and y(t+n) is determined to be a positive middle level (S105). In operation S106, a level error corresponding to a difference between the negative middle level, the value of data y(t+n) and a corresponding reference value, and a level error corresponding to a difference between a corresponding reference value and the positive middle level, the value of data y(t+n−1), are detected. If the product of the sampling data y(t+n−1) and y(t+n) is not less than 0, or if operation S104 or operation S106 is completed, operations S101 through S106 are reiterated to determine positive and negative middle levels for the next sample (S107).

Figure 5:
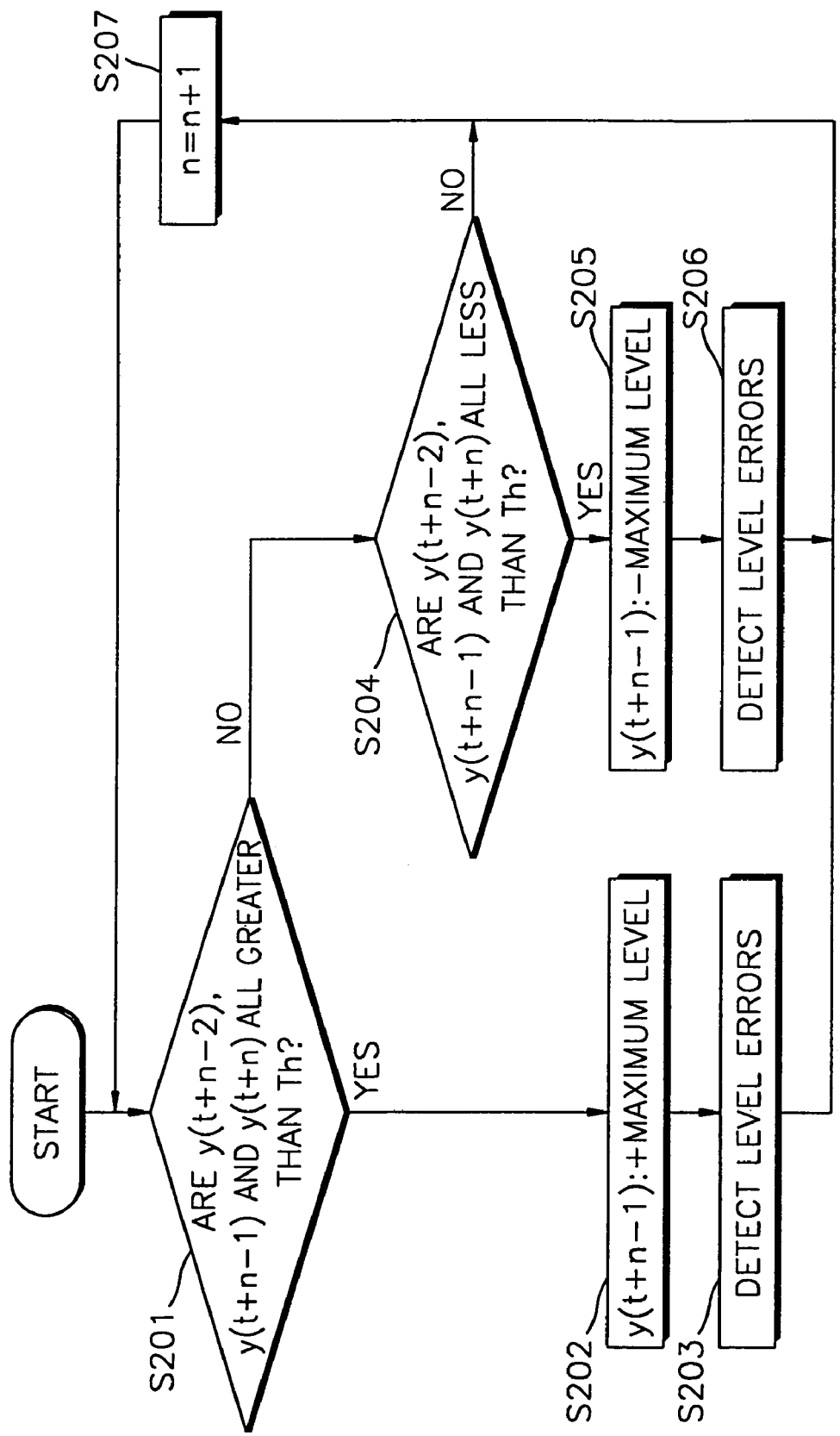
FIG. 5 is a flowchart illustrating an error detection method using the positive and negative maximum levels of the output value of the equalizer when a PR (a,b,a) or PR (a,b,b,a) type Viterbi detector is adopted.

FIG. 5 is a flowchart illustrating a preferred embodiment of an error detection method using the positive and negative maximum levels extracted from the output signal $y_k$ of the equalizer 106 when a PR(a,b,a) or PR(a,b,b,a) type Viterbi decoder is adopted.

It is determined whether all of three successive sampling data y(t+n−2), y(t+n−1) and y(t+n) are greater than a threshold value Th (S201). If the operation at S201 is yes, the middle sampling data y(t+n−1) is determined to be a positive maximum level (S202). Next, a level error corresponding to a difference between the positive maximum level, the value of y(t+n−1), and a corresponding reference value is detected (S203).

If, at operation S201, any of the sampling data y(t+n−2), y(t+n−1) and y(t+n) is less than the threshold value Th, it is determined whether all of the three successive data y(t+n−2), y(t+n−1) and y(t+n) are less than the threshold value Th (S204). If yes, the middle sampling data y(t+n−1) is determined to be a negative maximum level (S205). Next, a level error corresponding to a difference between the negative maximum level, the value of y(t+n−1), and a corresponding reference value is detected (S206).

If, at operation S204, at least one of the successive sampling data y(t+n−2), y(t+n−1) and y(t+n) is not less than the threshold value Th, or if operation S203 or S206 is completed, operations S201 through S206 are reiterated to determine positive and negative maximum levels for the next sample (S207).

Figure 6:
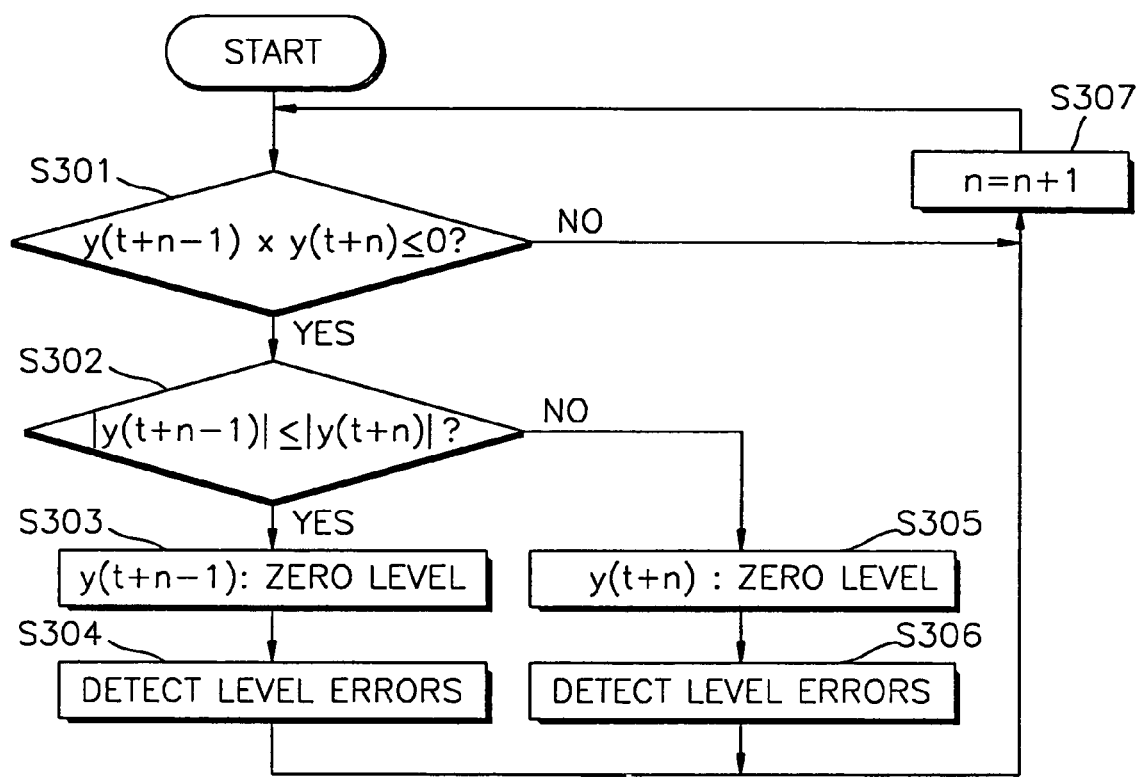
FIG. 6 is a flowchart illustrating an error detection method using the zero level of the output value of the equalizer when a PR (a,b,b,a) type Viterbi detector is adopted.

FIG. 6 is a flowchart illustrating a preferred embodiment of an error detection method using the zero level extracted from the output signal $y_k$ of the equalizer 106 when a PR(a,b,b,a) type Viterbi decoder is adopted.

First, it is determined whether the product of the successive sampling data y(t+n−1) and y(t+n) is less than or equal to 0 (S301). If the operation S301 is yes, then the absolute values of the sampling data y(t+n−1) and y(t+n) are compared (S302). If the absolute value of the leading sampling data y(t+n−1) is less than or equal to the absolute value of the other sampling data y(t+n), the sampling data y(t+n−1) is determined to be the zero level (S303). Then, a level error corresponding to the difference between the data value of y(t+n−1) and a reference value is detected (S304). If it is determined at operation S302 that the absolute value of the sampling data y(t+n) is smaller than that of the leading sampling data y(t+n−1), the sampling data y(t+n) is determined to be the zero level (S305). Then, a level error corresponding to the difference between the data value of the sampling data y(t+n) and the reference value is detected (S306). If, at operation S301, the product of the two sampling data y(t+n−1) and y(t+n) is greater than 0, or if the operation S304 or the operation S306 is completed, operations S301 through S306 are reiterated to detect the zero level for the next sample y(t+n+1) (S307).

Figure 7:
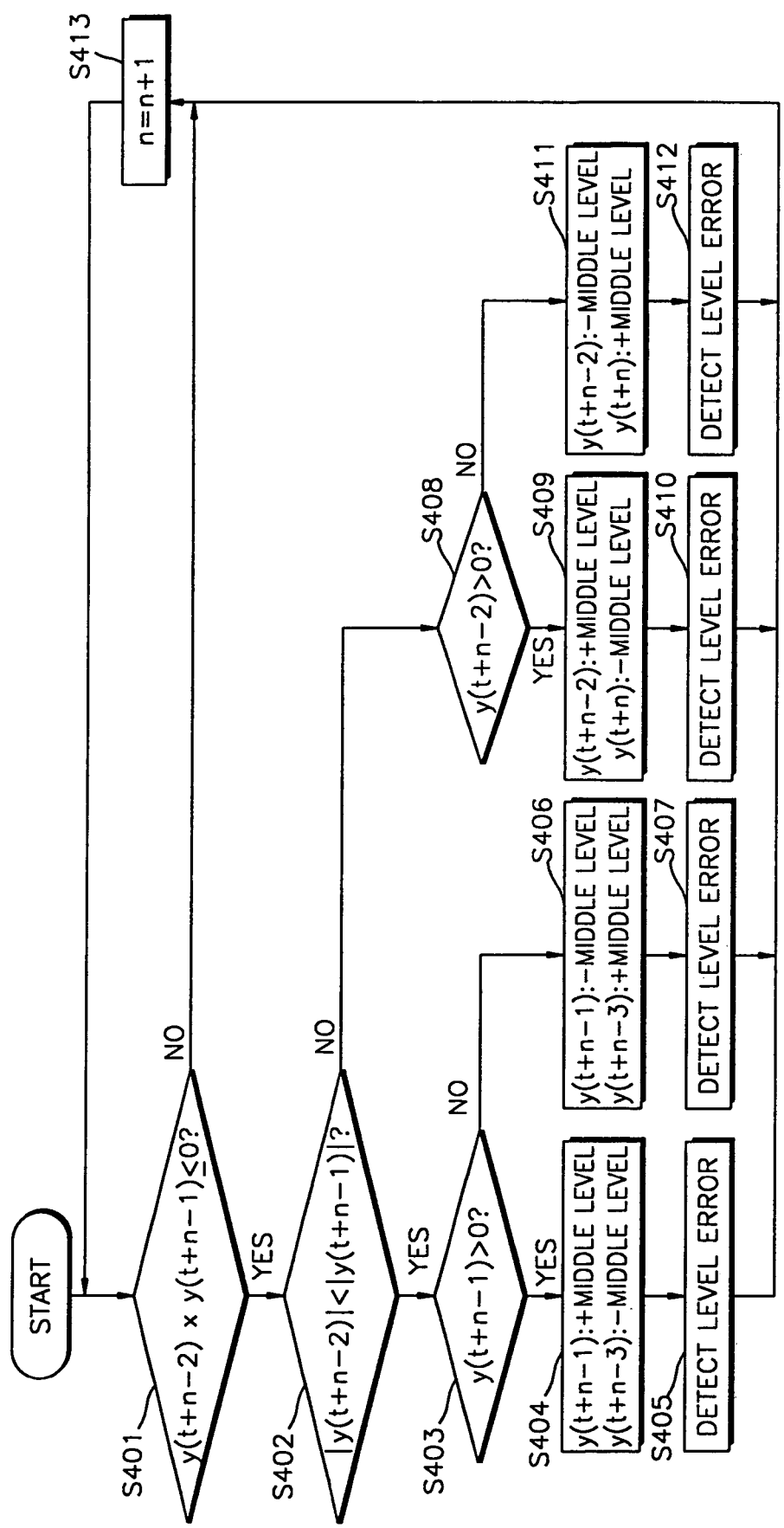
FIG. 7 is a flowchart illustrating an error detection method using the positive and negative middle levels of the output value of the equalizer when a PR (a,b,b,a) type Viterbi detector is adopted.

FIG. 7 is a flowchart illustrating a preferred embodiment of an error detection method using the positive and negative minimum levels extracted from the output signal $y_k$ of the equalizer 106 when a PR(a,b,b,a) type Viterbi decoder is adopted.

It is determined whether the product of the two successive data y(t+n−2) and y(t+n−1) is less than or equal to 0 (S401). If the operation at S401 is yes, the absolute values of the sampling data y(t+n−2) and y(t+n−1) are compared (S402). Then, it is individually determined whether the data value of y(t+n−1) is greater than 0 and whether y(t+n−2) is greater than 0. If the sampling data is greater than 0, the sampling data is determined to be the positive middle level. If the sampling data is less than 0, the sampling data is determined to be the negative middle level.

In particular, if the absolute value of the following sampling data y(t+n−1) is greater than the leading sampling data y(t+n−2) (S402), and if the data value of the sampling data y(t+n−1) is greater than 0 (S403), the sampling data y(t+n−1) is determined to be a positive middle level, and the preceding sampling data y(t+n−3) of the sampling data y(t+n−2) is determined to be a negative middle level (S404). Then, a level error corresponding to the difference between the data value of the positive middle level, y(t+n−1), and a reference value, and a level error corresponding to the difference between the data value of the negative middle level, y(t+n−3), and a reference value, are detected (S405).

If it is determined in operation S403 that the data value of the sampling data y(t+n−1) is not greater than 0, the sampling data y(t+n−1) is determined to be a negative middle level, and the preceding sampling data y(t+n−3) of the sampling data y(t+n−2) is determined to be a positive middle level (S406). Then, level errors for the negative and positive middle levels y(t+n−1) and y(t+n−3), which correspond to differences between the negative and positive middle levels and corresponding reference values, are detected (S407).

If it is determined at operation S402 that the absolute value of the leading sampling data y(t+n−2) is greater than or equal to that of the sampling data y(t+n−1), and if the data value of the sampling data y(t+n−2) is greater than 0 (S408), the sampling data y(t+n−2) is determined to be a positive middle level, and the sampling data y(t+n) following the sampling data y(t+n−1) is determined to be a negative middle level (S409). Then, level errors for the positive and negative middle levels, y(t+n−2) and y(t+n), which correspond to differences between the data values of the sampling data y(t+n−2) and y(t+n), and corresponding reference values, are detected (S410).

If it is determined at operation 408 that the data value of the sampling data y(t+n−2) is not greater than 0, the sampling data y(t+n−2) is determined to be a negative middle level, and the sampling data y(t+n) following the sampling data y(t+n−1) is determined to be a positive middle level (S411). Then, level errors for the negative and positive middle levels, y(t+n−2) and y(t+n), which correspond to differences between the data values of the sampling data y(t+n−2) and y(t+n), and corresponding reference values, are detected (S412).

If it is determined at operation S401 that the product of the two sampling data y(t+n−2) and y(t+n−1) is greater than 0, or if operation S405, S407, S410 or S412 is completed, operations 401 through 412 are reiterated to detect the positive and negative middle levels for the next sample y(t+n) (S413).

Figure 8:
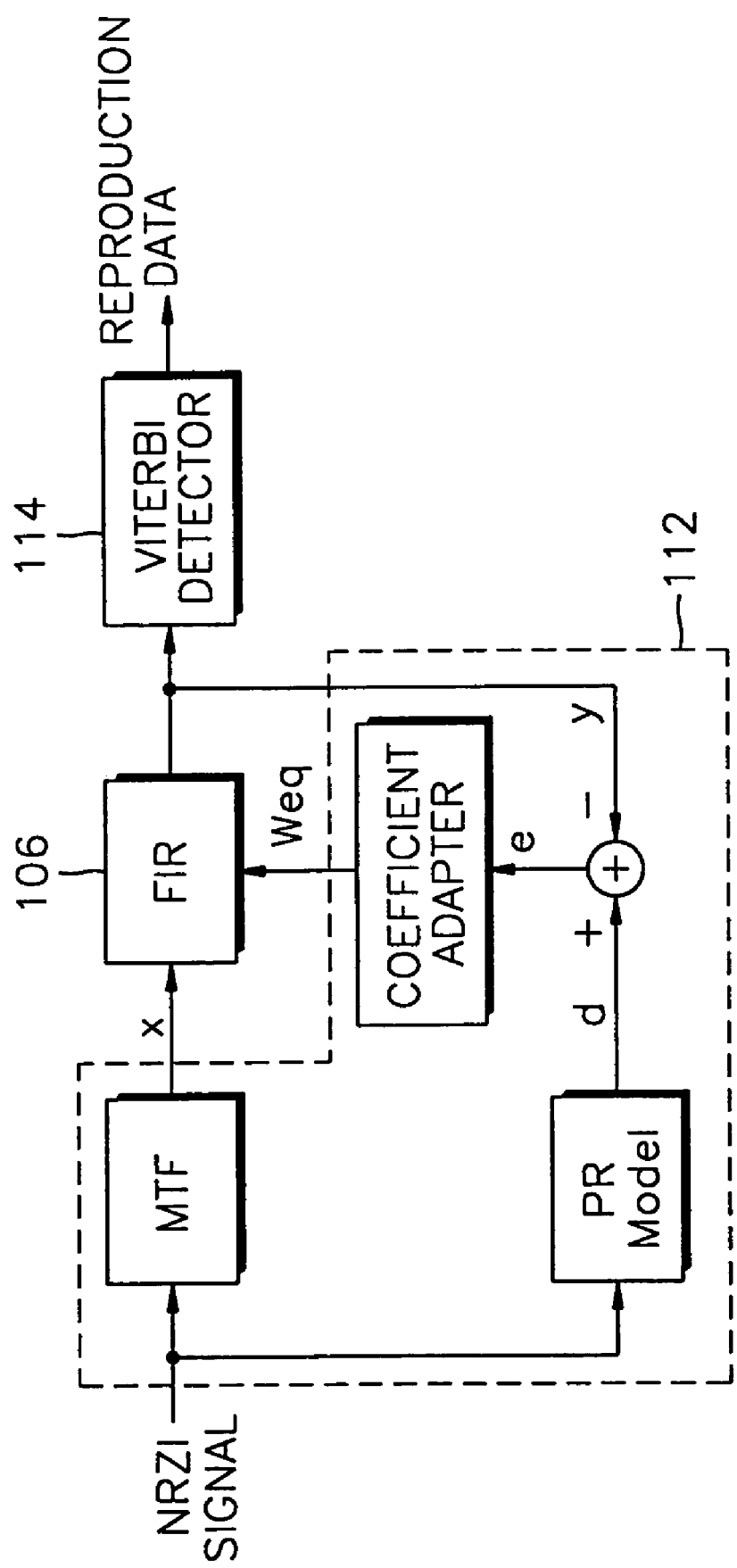
FIG. 8 is a diagram illustrating a channel adaptation model which is applied in calculating coefficients to be stored in the coefficient bank 112 of FIG. 3.

FIG. 8 is a diagram illustrating a channel adaptation model which is applied in calculating coefficients to be stored in the coefficient bank 112 of FIG. 3.

Assuming that a channel model when defocusing or tilting occurs is a modulation transfer function (MTF) channel, a radio frequency (RF) signal produced through the channel is x, and the output from the equalizer 106 is y, the coefficient adapter of the coefficient bank 112, as shown in FIG. 8, outputs a coefficient Weq which enables a level error e between an initial non-return zero inversion (NRZI) signal passed through a PR model, for example, PR(a,b,a) or PR(a,b,b,a), not through the MTF channel, to converge to zero. Here, the PR model refers to the type of the Viterbi decoder 114 used. The constituent blocks of the coefficient bank 112 shown in FIG. 8 are implemented by software, not by hardware.

Such extraction of the coefficient Weq may be performed for limited cases, for example, when the degree of defocusing is 15 μm, 30 μm, 45 μm or 60 μm, or when a tangential tilt angle is 0.125°, 0.25°, 0.375° or 0.5°, and then the obtained coefficients may be stored in the coefficient bank 112.

Figure 9:
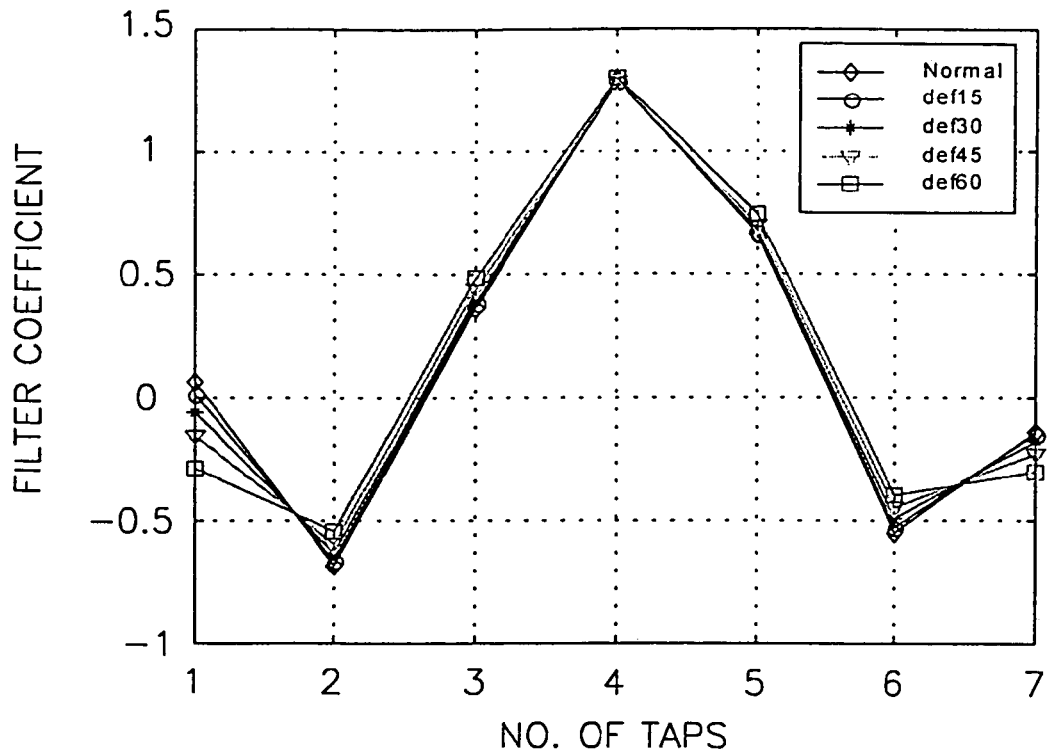
FIG. 9 illustrates variations in the filter tap coefficients of the equalizer when defocusing occurs.

When the degree of defocusing is varied at 15 μm, 30 μm, 45 μm and 60 μm, the tap coefficients of the equalizer (7-tap) 106, which were obtained by applying the method illustrated in FIG. 8, are shown versus the number of taps in FIG. 9. When the tangential tilt angle is 0.125°, 0.25°, 0.375° and 0.5°, the tap coefficients of the equalizer (7-tap) 106, which were obtained by the method of FIG. 8, are shown versus the number of taps in FIG. 10.

Figure 11:
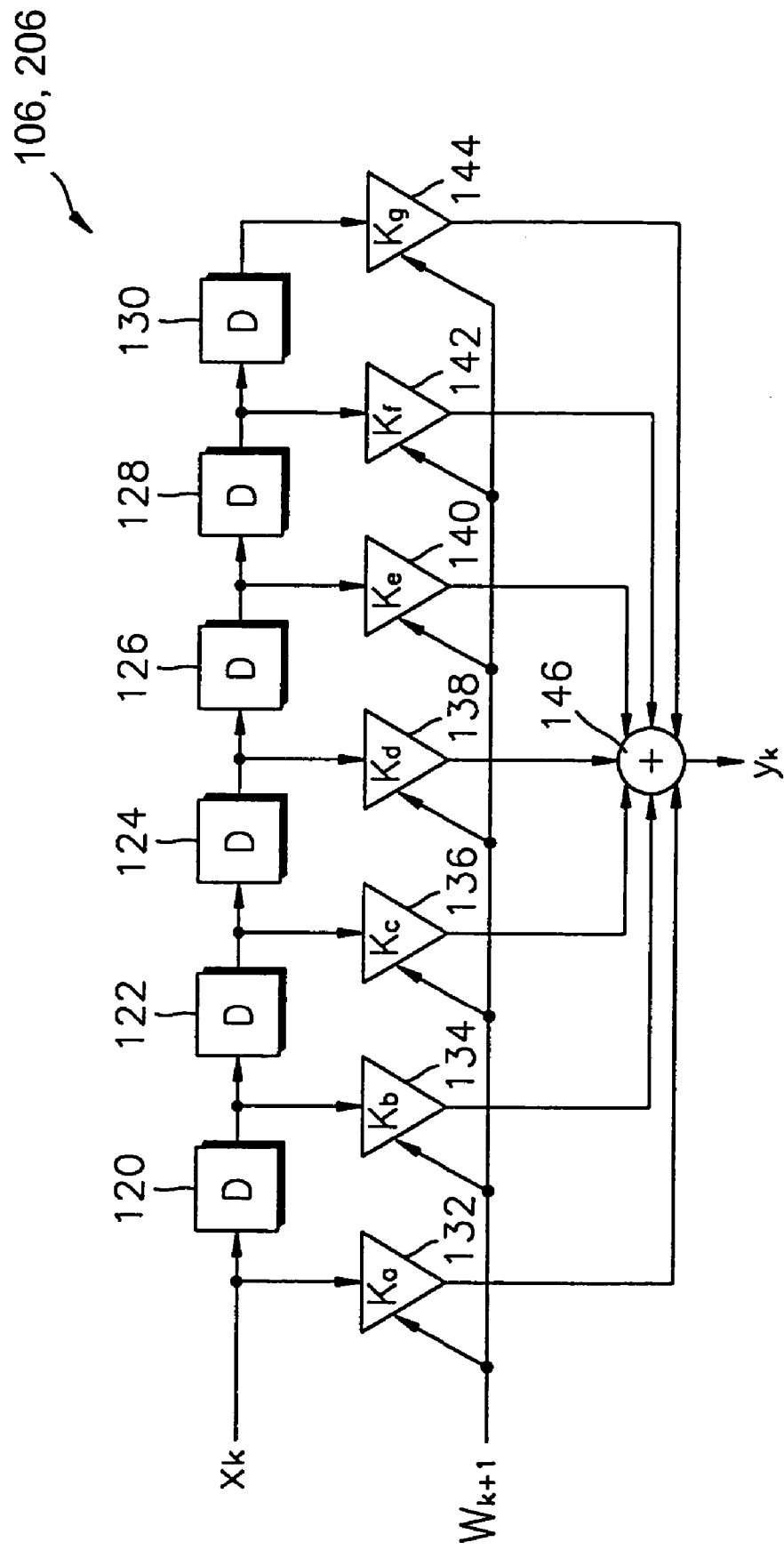
FIG. 11 illustrates an example of the structure of the equalizer applied to the data reproduction apparatus according to the present invention.

The structure of the equalizer 106, which is constructed of a 7-tap FIR filter, is shown in FIG. 11. The 7-tap FIR filter is characterized in that each tap coefficient can be separately and asymmetrically set around the center tap $K_d$. In FIG. 11, $x_k$ indicates the input data of the equalizer 106, $y_k$ indicates the output data of the equalizer 106, and $W_{k+1}$ indicates the coefficients of the equalizer 106 after adaptation. Reference numerals 120, 122, 124, 126, 128 and 130 represent delays, reference numerals 132, 134, 136, 138, 140, 142 and 144 represent multipliers, and reference numeral 146 represents an adder.

Figure 10:
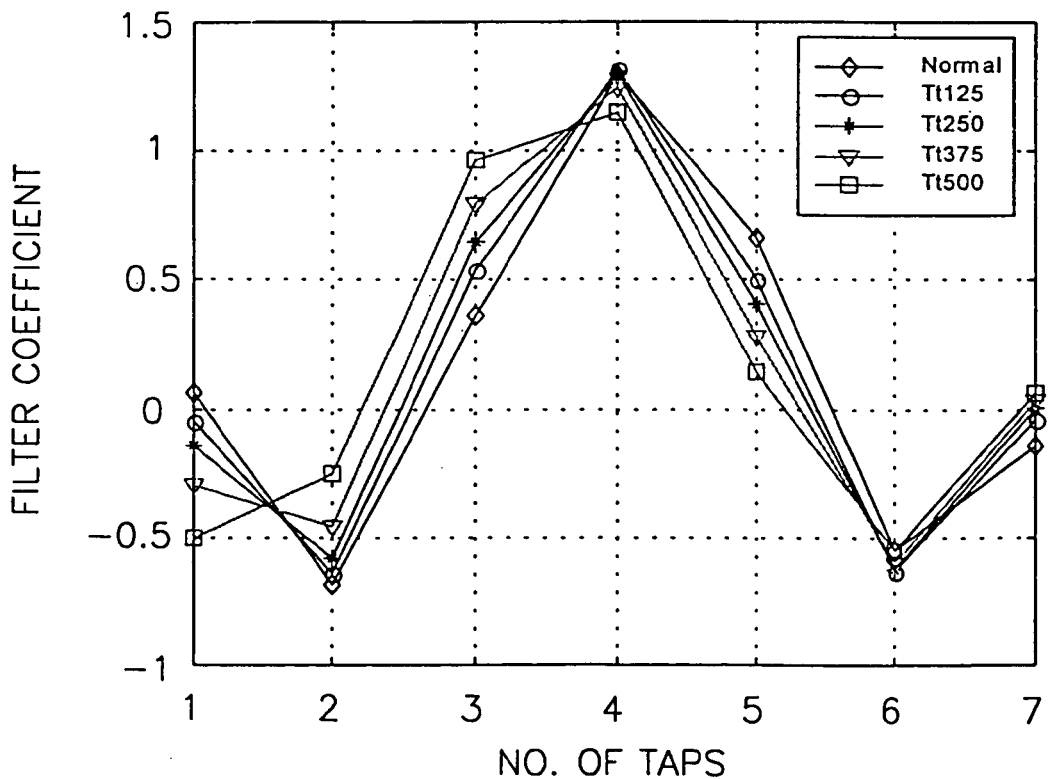
FIG. 10 illustrates variations in the filter tap coefficients of the equalizer when tangential tilting occurs.
Figure 12A:
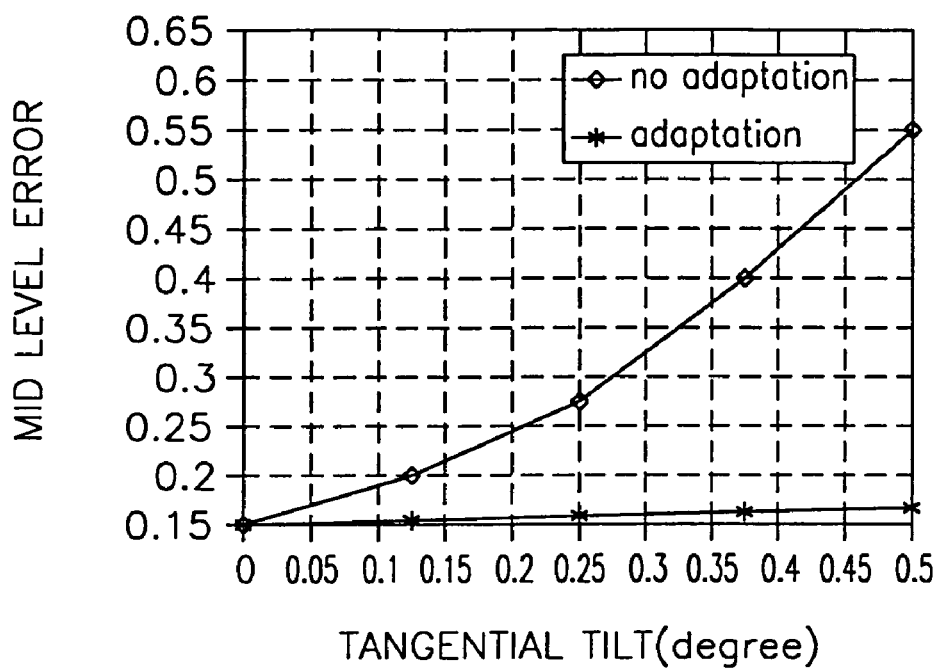
FIGS. 12A through 12C illustrate the variation in the level error with respect to tangential tilt angle when filter coefficients are adapted according to the present invention, and when they are not adapted.
Figure 12B:
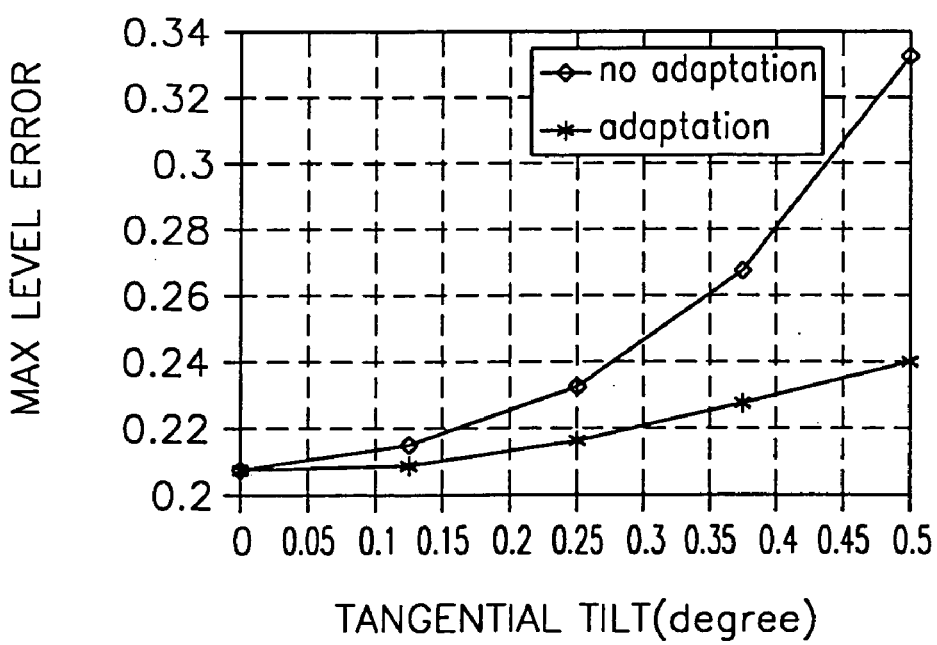
Figure 12C:
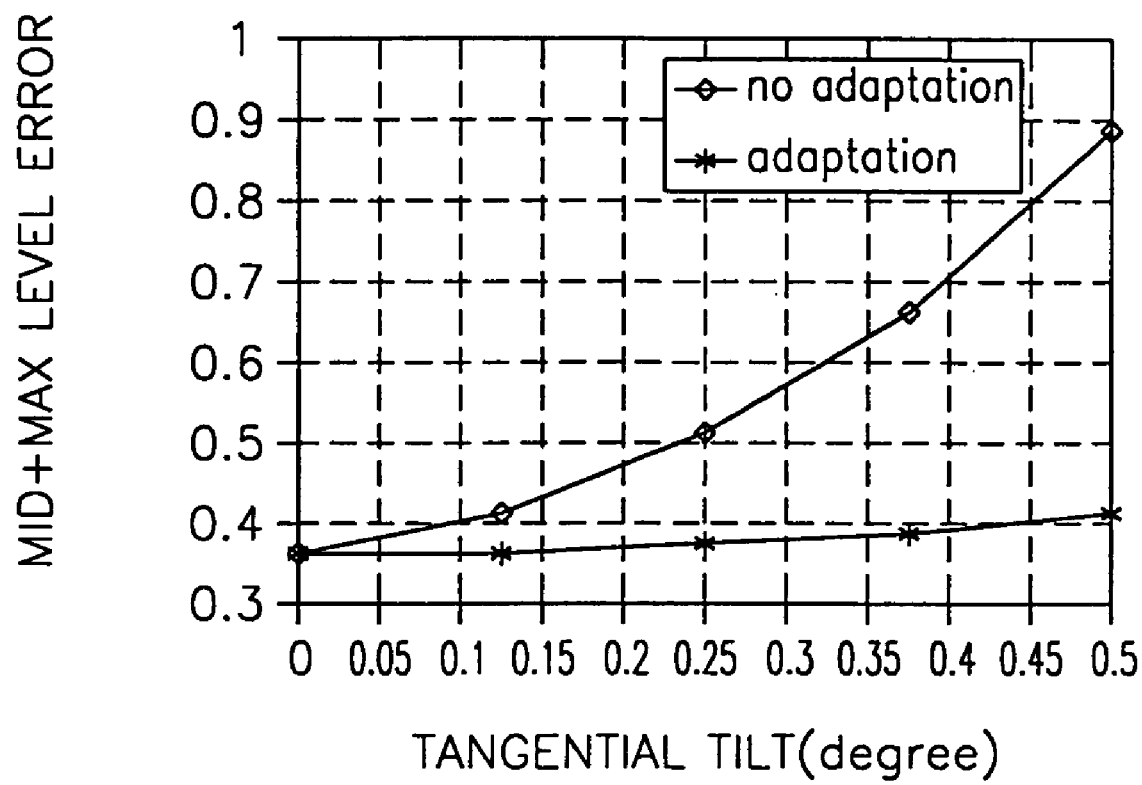

FIGS. 12A through 12C comparatively show level errors with respect to variations in tangential tilt angle when the tap coefficients of the equalizer are fixed, and adapted as shown in FIG. 10. Here, a PR(1,2,1) type Viterbi detector was used. For the case of using adapted coefficients, although the tangential tilt angle is increased up to 0.5°, the variation in level error is much less than when fixed coefficients are used. Also, the difference in the amplitudes of level errors when using fixed and adapted coefficients, respectively, increases at larger tangential tilt angles. A Viterbi decoder of type PR(1,2,1) has +4 (1+2+1) as a positive maximum level, −4 (−1−2−1) as a negative maximum level, +2 (−1+2+1) as a positive middle level and −2 (+1−2−1) as a negative middle level, and does not have a zero level.

In particular, FIG. 12A shows two plots of a variation in the middle level error with respect to tangential tilt angle, one plot showing results when the tap coefficients of the equalizer are adapted (adaptation) and the other plot showing results when the tap coefficients of the equalizer are fixed (no adaptation). Similarly, the two plots of FIG. 12B show a variation in the maximum level error with respect to tangential tilt angle, one plot showing a result when the tap coefficients of the equalizer are adapted, and the other plot showing a result when the tap coefficients of the equalizer are fixed. Also similarly, the two plots of FIG. 12C show a variation in the sum of the middle and maximum level errors with respect to tangential tilt angle, one plot showing a result when the tap coefficients of the equalizer are adapted and the other plot showing a result when the tap coefficients of the equalizer are fixed.

Figure 13:
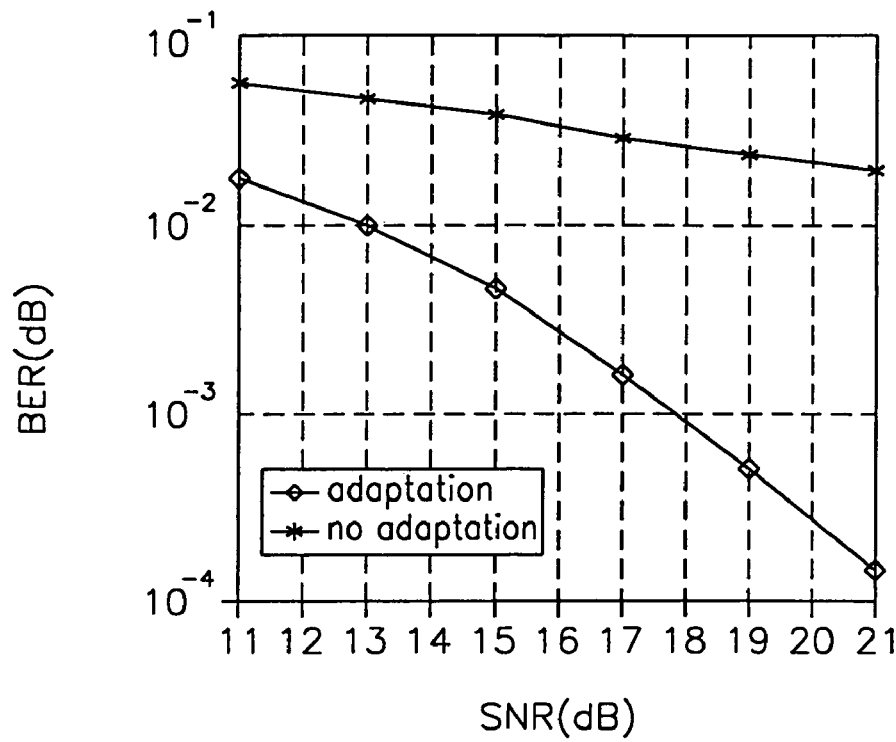
FIG. 13 illustrates the effect of using adapted filter coefficients when tangential tilting by 0.5° occurs.
Figure 14:
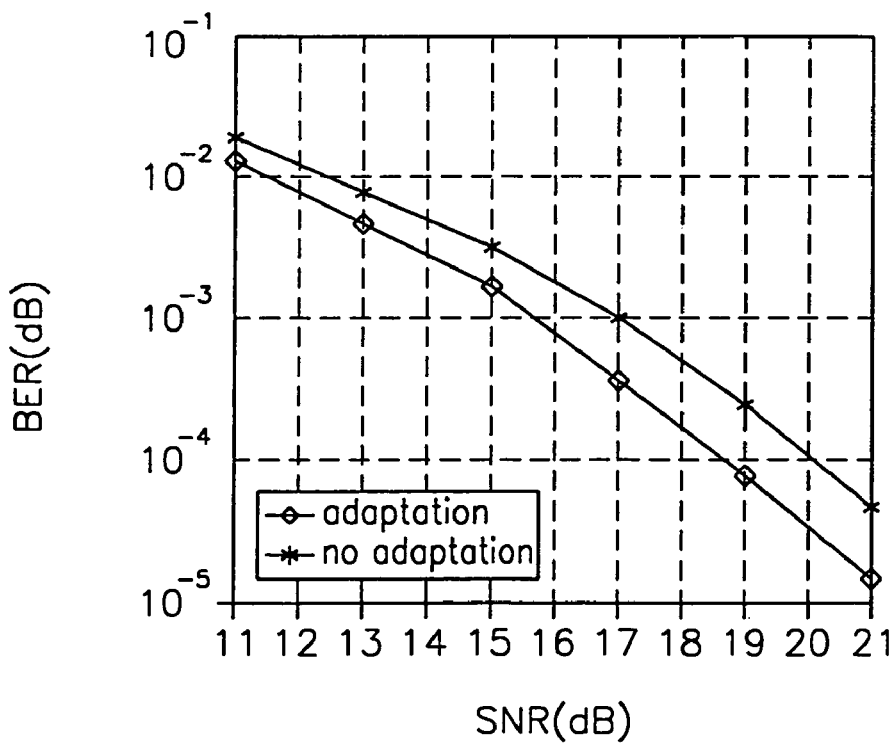
FIG. 14 illustrates the effect of using adapted filter coefficients when a defocusing of 60 µm occurs.

FIGS. 13 and 14 show that the bit error rate (BER) of a reproduction signal output from the Viterbi decoder can be reduced more by using adapted coefficients than by using fixed coefficients. In particular, FIG. 13 illustrates the effect of using adapted coefficients on the error rate of the reproduction signal, compared to the case of using fixed coefficients, when a tangential tilt of 0.5° occurs. FIG. 14 illustrates the effect of using adapted coefficients on the error rate of the reproduction signal, compared to the case of using fixed coefficients, when defocusing of 60 μm occurs. In FIGS. 13 and 14, BER is plotted as a function of Signal to Noise Ratio (SNR) where the SNR is expressed in dB.

Figure 15:
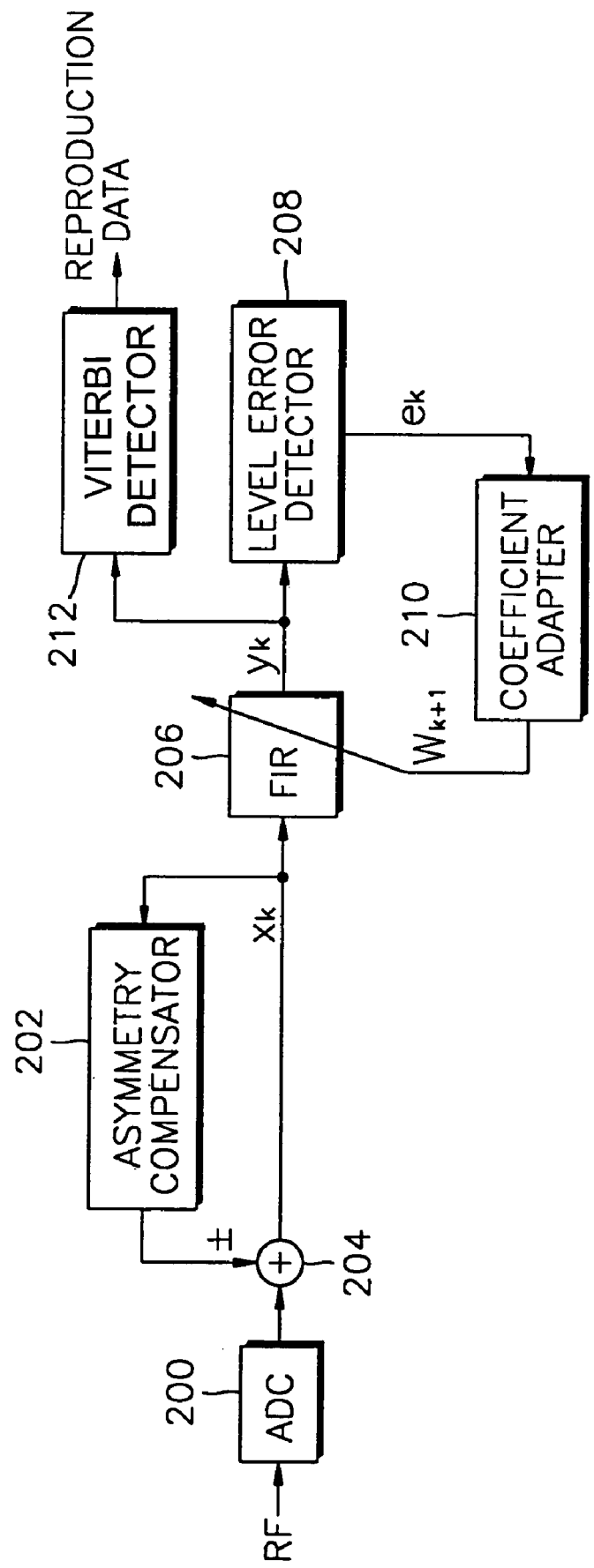
FIG. 15 is a block diagram of another embodiment of the data reproduction apparatus according to the present invention.

Another embodiment of the data reproduction apparatus according to the present invention is shown in FIG. 15. As shown in FIG. 15, the data reproduction apparatus includes an ADC 200, an asymmetry compensator 202, an adder 204, an equalizer 206 and a Viterbi detector 212. The elements are the same as these of FIG. 3, and thus a description of their structure will not be repeated here.

Assuming that a target level value is $t_k$, the error value $e_k$ output from the level error detector 208 is obtained by subtracting the level value $y_k$ detected as shown in FIGS. 4 through 7 from the target level value $t_k$, which is expressed by $e_k=t_k-y_k$. As shown in FIG. 11, the filter coefficients of the equalizer 206 are obtained by adaptation in the coefficient adapter 210, using formula 1 to minimize the error value $e_k$.

$$W_{k+1}=W_k+2\mu \cdot e_k \cdot x_k \quad (1)$$

where $W_{k+1}$ indicates a filter coefficient of the equalizer after adaptation, $W_k$ indicates a filter coefficient of the equalizer before adaptation, μ is a coefficient relating to equalization rate (0.001 for the embodiment shown in FIG. 15), $e_k$ indicates a level error, and $x_k$ indicates an RF signal after asymmetry correction.

Figure 16:
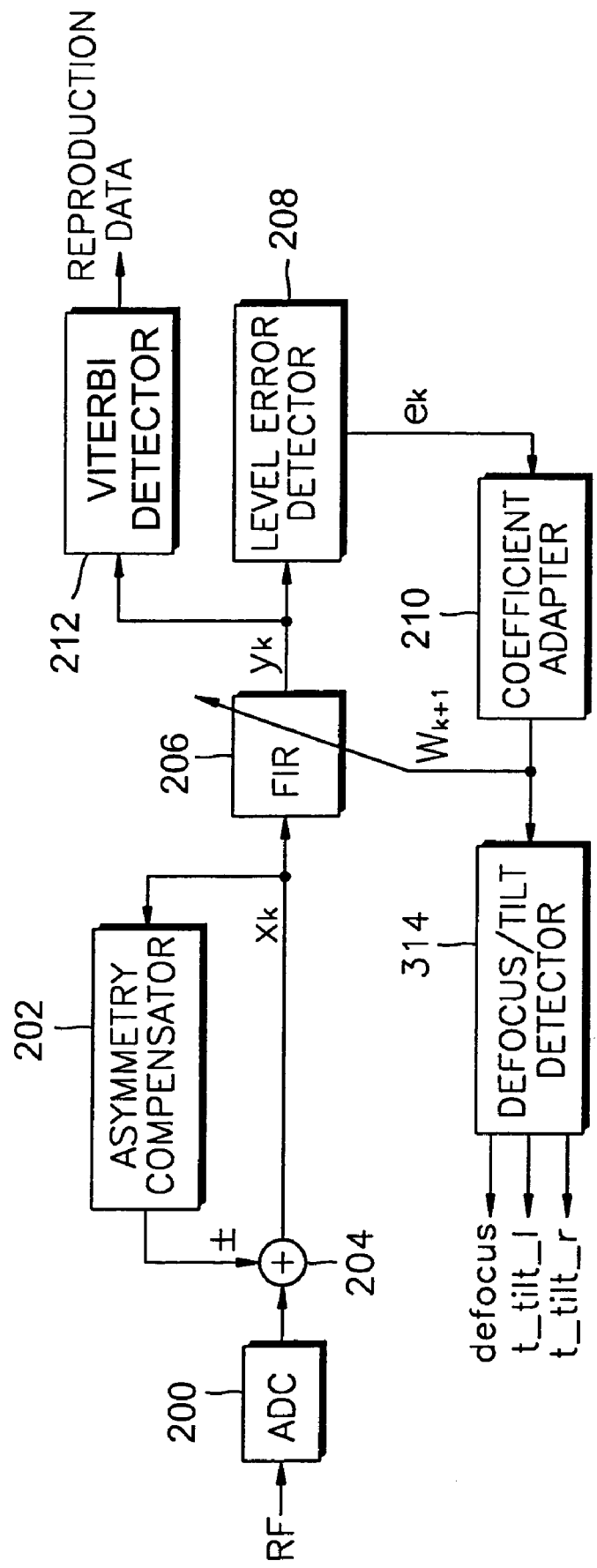
FIG. 16 is a block diagram of still another embodiment of the data reproduction apparatus according to the present invention, which detects defocusing/tangential tilting.

FIG. 16 illustrates still another embodiment of a data reproduction apparatus according to the present invention, further having a defocus/tilt detection function. The only difference between the structure of this embodiment and the structure shown in FIG. 15 is that a defocus/tilt detector 314 is further included. Thus, only the operation of the defocus/tilt detector 314 will be described with reference to the tap coefficient variation curves shown in FIGS. 17A through 17C and FIGS. 18A through 18C, and FIG. 19.

Figure 17A:
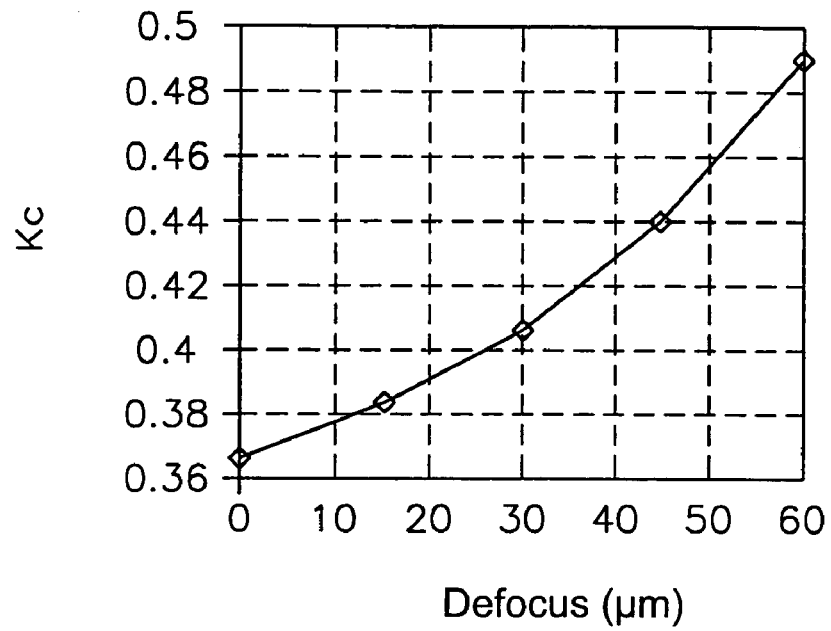
FIGS. 17A through 17C illustrate variations in filter tap coefficients of the equalizer with respect to a degree of defocusing.
Figure 17B:
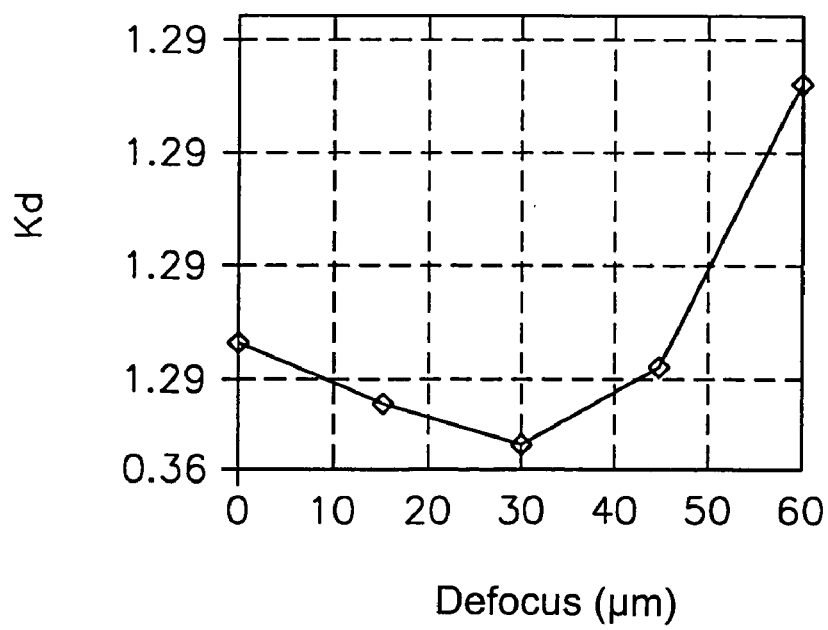
Figure 17C:
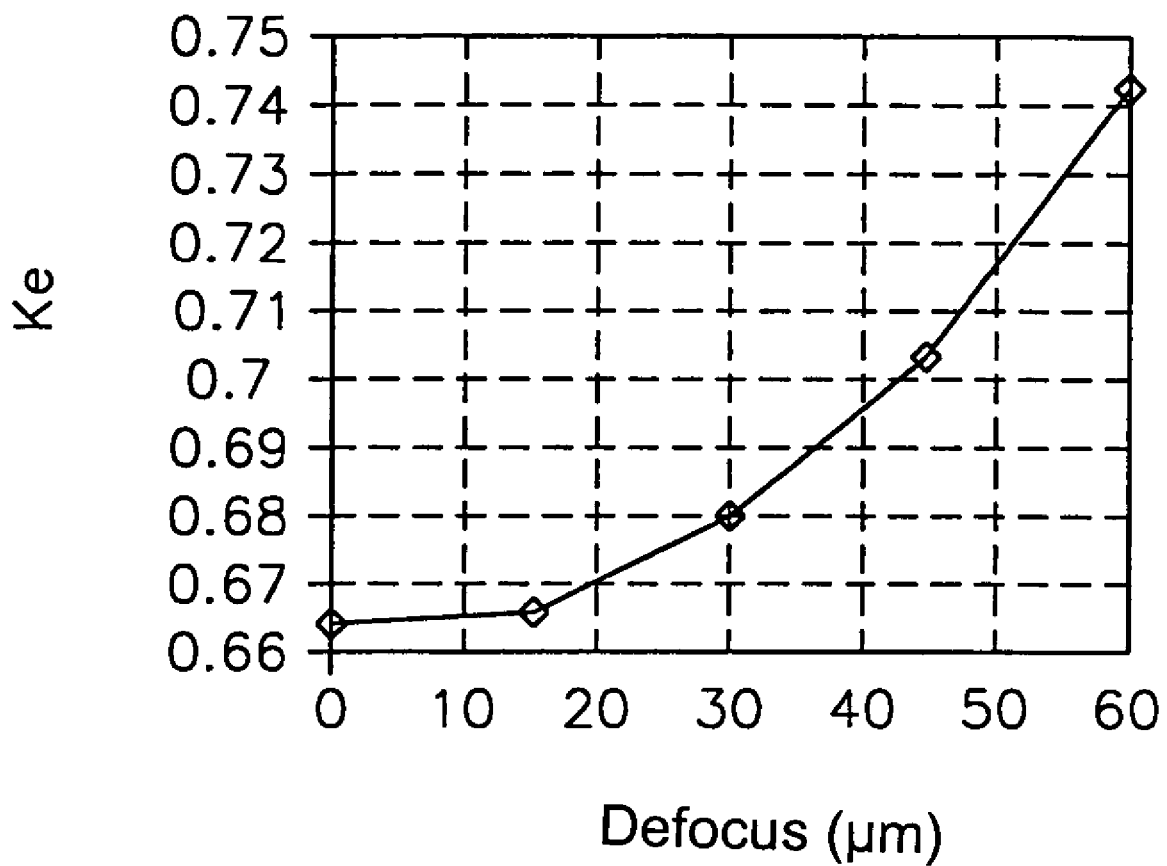

When defocusing occurs, as shown in FIGS. 17A through 17C, the center tap coefficient $K_d$ of the equalizer 206 almost does not change, while both the tap coefficients $K_c$ and $K_e$, which are on the left and right of the center tap coefficient $K_d$, respectively, tend to increase. FIGS. 17A through 17C illustrate variations of the left tap coefficient $K_c$, the center tap coefficient $K_d$, and the right tap coefficient $K_e$, respectively, according to a degree of defocusing. Thus, when it is detected that the left tap coefficient $K_c$ and the right tap coefficient $K_e$ increase, the defocus/tilt detector 314 outputs a defocus signal.

Figure 18A:
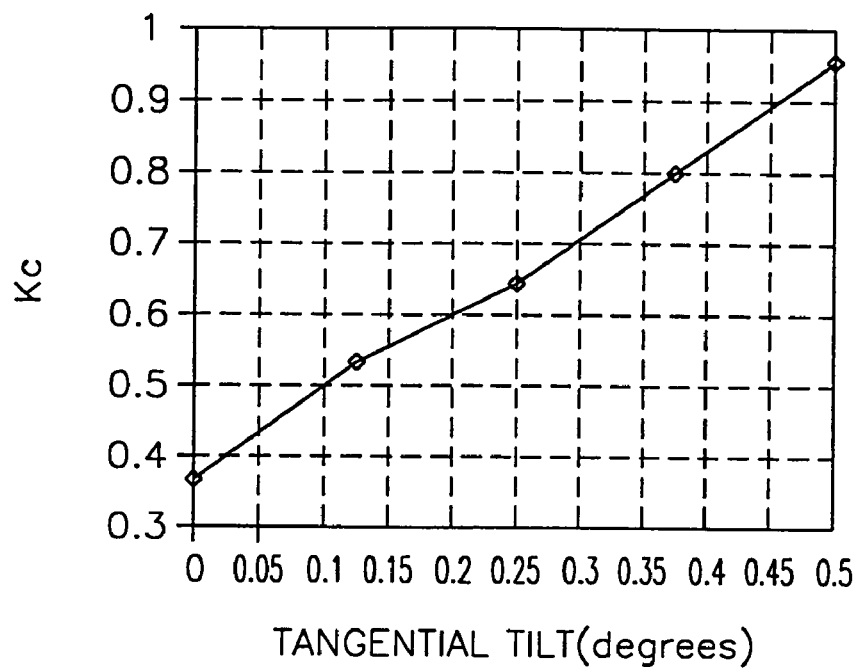
FIGS. 18A through 18C illustrate variations in filter tap coefficients of the equalizer with respect to tangential tilt angle.
Figure 18B:
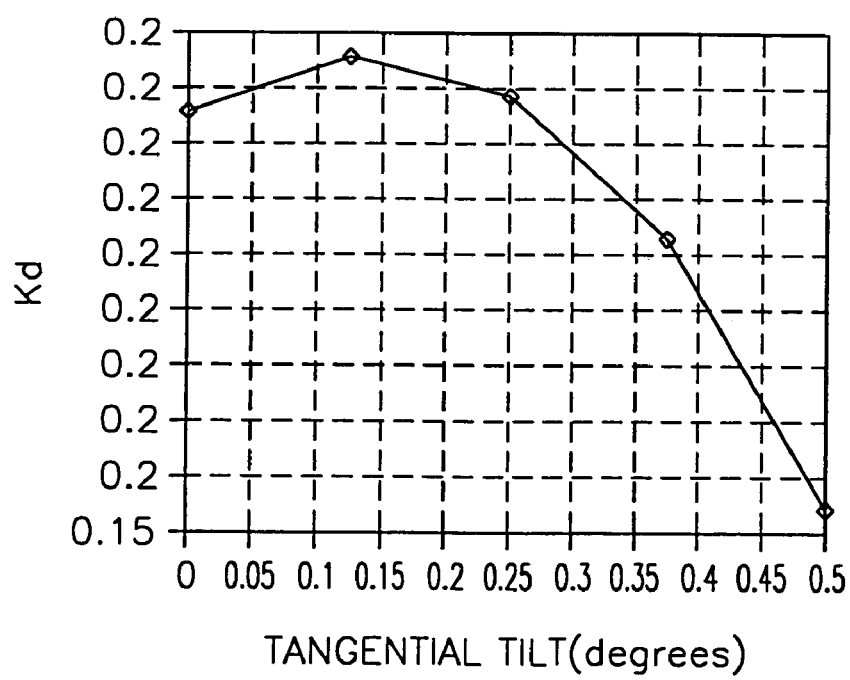
Figure 18C:
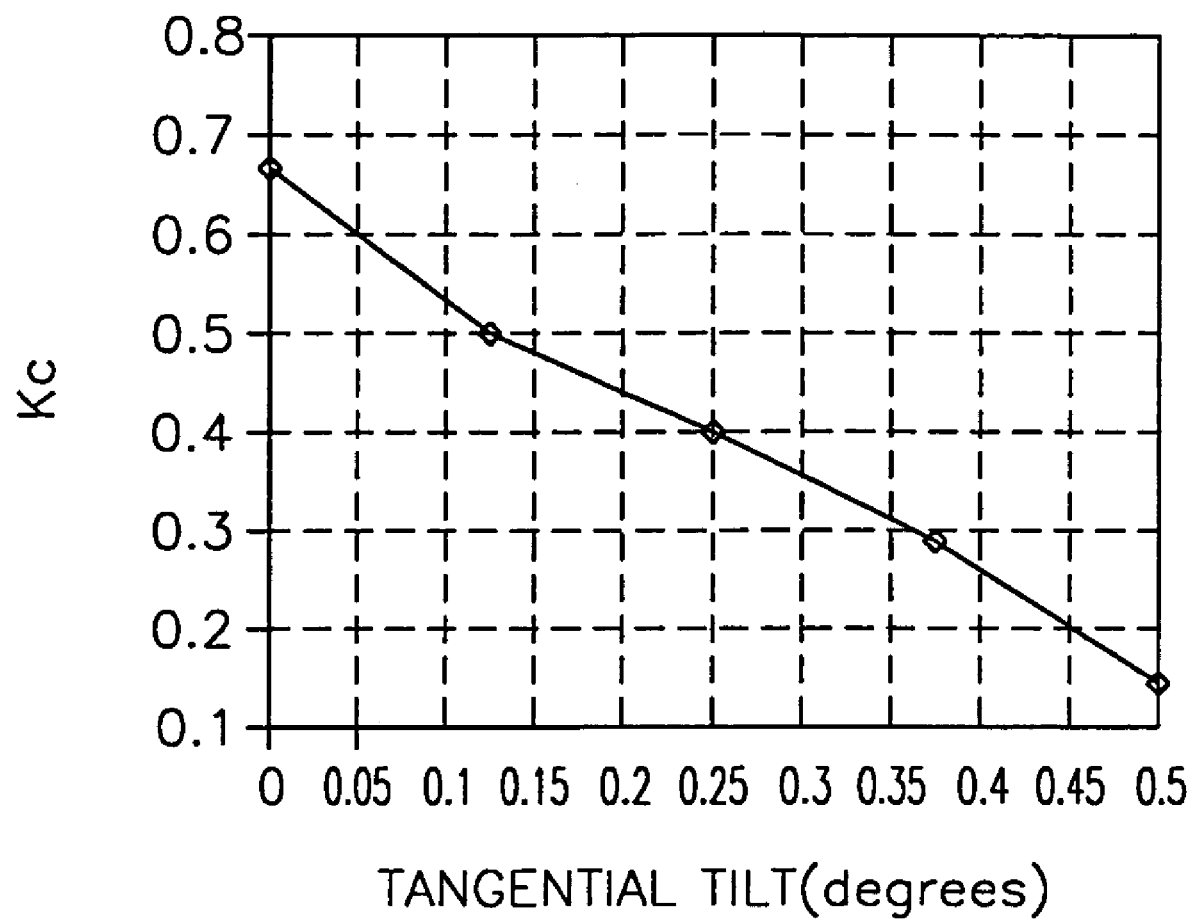

Meanwhile, when tangential tilting occurs, the filter coefficients of the equalizer 206 vary as shown in FIGS. 18A through 18C. The left and right tap coefficients $K_c$ and $K_e$ (FIG. 11) show opposite tendencies around the central tap coefficient $K_d$, i.e., if one of the left and right tap coefficients $K_c$ and $K_e$ increases, the other tap coefficient decreases. Thus, according to which tap coefficient increases or decreases, the direction of the tangential tilting can be inferred. FIGS. 18A through 18C illustrate variations of the left tap coefficient $K_c$, the center tap coefficient $K_d$, and the right tap coefficient $K_e$, respectively, according to a tangential tilt angle. Thus, by detecting which tap coefficient, $K_c$ or $K_e$, around the center tap coefficient $K_d$ increases or decreases, the defocus/tilt detector 314 outputs a tangential tilt signal t_tilt_r or t_tilt_l. Here, the signal t_tilt_r indicates that a recording medium is tilted in the moving direction of a pickup, and the signal t_tilt_l indicates that the recording medium is tilted in the opposite direction.

Figure 19:
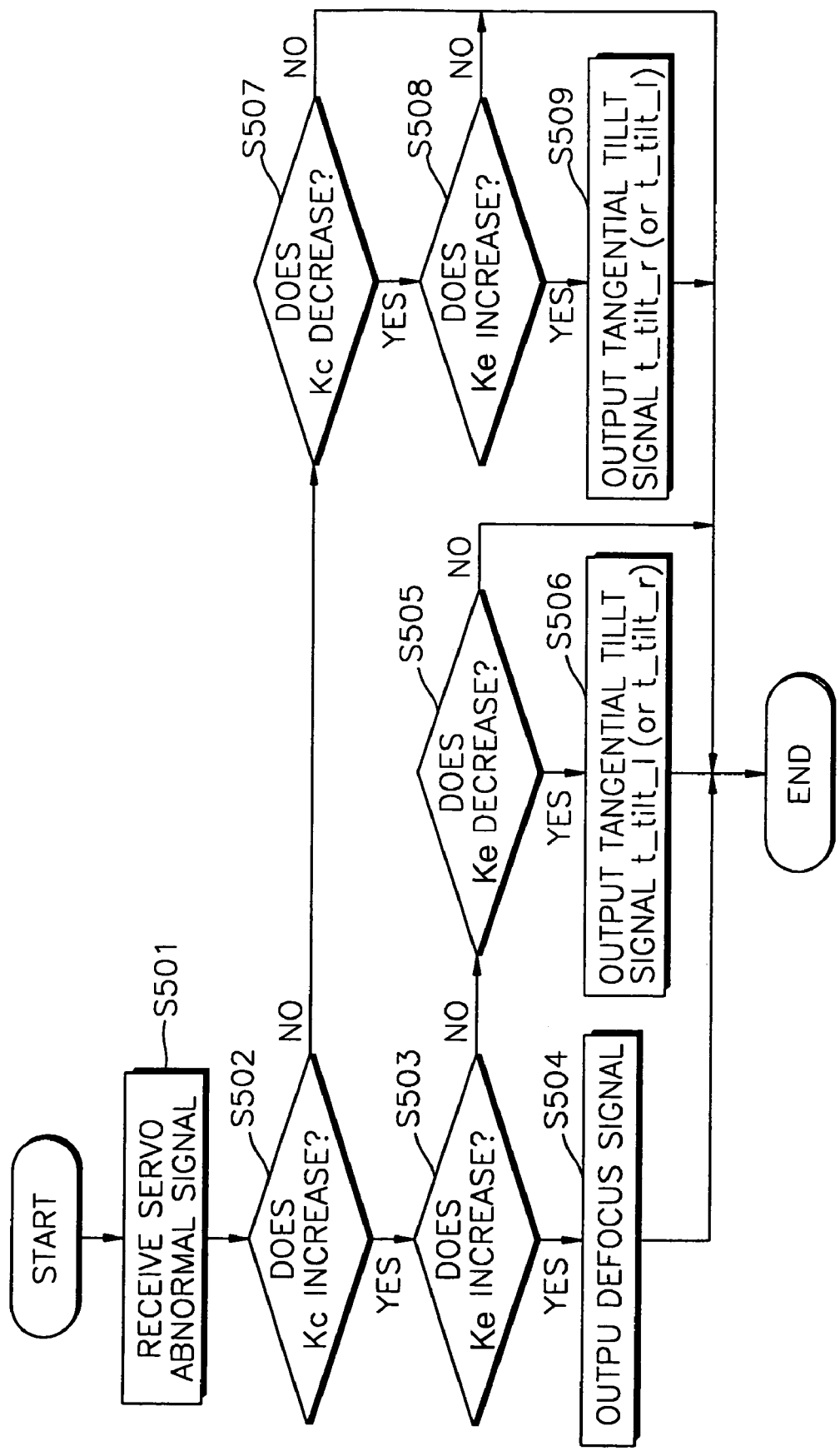
FIG. 19 is a flowchart illustrating the detection of defocusing or tilting by the defocus/tilt detector shown in FIG. 16.

FIG. 19 is a flowchart illustrating a detection of defocusing or tilting by the defocus/tilt detector shown in FIG. 16. Referring to FIG. 19, the operation of the defocus/tilt detector begins with reception of a servo abnormal signal (S501). Although not illustrated in FIG. 19, the servo abnormal signal can be detected directly from a servo unit or a pickup unit by a system microcomputer.

Next, it is determined whether the filter coefficient $K_c$ on the left of the center tap coefficient $K_d$ increases (S502). If the left filter coefficient $K_c$ increases, it is determined whether the filter coefficient $K_e$ on the right of the center tap coefficient $K_d$ increases (S503). If both the left and right filter coefficients $K_c$ and $K_e$ increase, a defocus signal is output (S504). If it is determined in step S503 that the filter coefficient $K_e$ does not increase, it is determined whether the filter coefficient $K_e$ decreases (S505). If the filter coefficient $K_c$ increases and the filter coefficient $K_e$ decreases, a tangential tilt signal t_tilt_l or t_tilt_r is output (S506).

If it is determined in S502 that the filter coefficient $K_c$ does not increase, it is determined whether the filter coefficient $K_c$ decreases (S507). If the filter coefficient $K_c$ decreases, it is determined whether the filter coefficient $K_e$ increases (S508). If the filter coefficient $K_c$ decreases (S507) and the filter coefficient $K_e$ increases (S508), a tangential tilt signal t_tilt_r or t_tilt_l is also output (S509).

As previously mentioned, the filter coefficients of the equalizer, which is connected in front of the Viterbi decoder, are selected such that the level error to be input to the Viterbi detector is minimized, thereby improving the reproduction performance.

The level error is detected by adapting the filter coefficients of the equalizer according to the PR type of the Viterbi decoder, so that the level error is minimized with enhanced reproduction characteristics.

In addition, the servo status can be inferred from variations in the filter coefficients of the equalizer. In other words, whether defocusing or tangential tilting occurs, and the direction of the tangential tilting can be detected. Thus, when jittering of data occurs due to defocusing or tilting, the error rate of data can be improved by adjusting the filter coefficients of the equalizer.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A data reproduction apparatus for detecting data based on partial response maximum likelihood (PRML), the apparatus comprising:

an equalizer comprising a digital filter;
a level error detector which extracts a level of an output value of the equalizer based on a reference level set in the data detector, and which detects a level error between the level of the output value and a predetermined reference value; and
a coefficient adapter which adapts filter coefficients of the equalizer such that a difference between the level error and a target level error is minimized, wherein:
the error detector determines the reference value to correspond to a zero level, a positive middle level, a negative middle level, a positive maximum level or a negative maximum level, which are classified depending on the partial response (PR) type of the data detector, based on comparing first sampling data with successive sampling data, and detects the level of the output value of the equalizer, and outputs a level error corresponding to a difference between the detected level and the determined reference value.

2. A data reproduction apparatus comprising:

a data detector which detects data based on partial response maximum likelihood;
an equalizer comprising a digital filter;
a level error detector which extracts a level of an output value of the equalizer based on a reference level set in the data detector, and predetermines at least one reference value corresponding to a zero level, positive and negative middle levels, and positive and negative maximum levels, which are classified depending on the partial response (PR) type of the data detector, and detects the level of the output value of the equalizer, and outputs at least one level error corresponding to a difference between the detected level and a corresponding reference value; and
a coefficient adapter which adapts filter coefficients of the equalizer such that a difference between the level error and a target level error is minimized,
wherein the level error detector determines whether the product of two successive sampling data output from the equalizer is less than 0, determines which one of the sampling data is greater than 0 if the product of the two successive sampling data is less than 0, determines the sampling data greater than 0 as the positive middle level, and the sampling data less than 0 as the negative middle level, and detects a plurality of the level errors corresponding to a difference between the respective values of the sampling data determined as the positive and negative middle levels, and corresponding reference values.

3. A data reproduction apparatus comprising:
a data detector which detects data based on partial response maximum likelihood;
an equalizer comprising a digital filter;
a level error detector which extracts a level of an output value of the equalizer based on a reference level set in the data detector, and predetermines at least one reference value corresponding to a zero level, positive and negative middle levels, and positive and negative maximum levels, which are classified depending on the partial response (PR) type of the data detector, and detects the level of the output value of the equalizer, and outputs at least one level error corresponding to a difference between the detected level and a corresponding reference value; and
a coefficient adapter which adapts filter coefficients of the equalizer such that a difference between the level error and a target level error is minimized,
wherein the level error detector determines whether first, second and third successive sampling data output from the equalizer are greater than a predetermined threshold value, determines the second successive sampling data as the positive maximum level if all of the first, second and third successive sampling data are greater than the predetermined threshold value, and determines the second sampling data as the negative maximum level if all of the first, second and third successive sampling data are less than the predetermined threshold value, and detects level errors corresponding to respective differences between the values of the sampling data determined as the positive and negative maximum levels and corresponding reference values.

4. A data reproduction apparatus comprising:
a data detector which detects data based on partial response maximum likelihood;
an equalizer comprising a digital filter;
a level error detector which extracts a level of an output value of the equalizer based on a reference level set in the data detector, and predetermines at least one reference value corresponding to a zero level, positive and negative middle levels, and positive and negative maximum levels, which are classified depending on the partial response (PR) type of the data detector, and detects the level of the output value of the equalizer, and outputs at least one level error corresponding to a difference between the detected level and a corresponding reference value; and
a coefficient adapter which adapts filter coefficients of the equalizer such that a difference between the level error and a target level error is minimized,
wherein the level error detector determines whether a product of two successive sampling data output from the equalizer is less than or equal to 0, and determines the sampling data whose absolute value is less than the absolute value of the other sampling data as the zero level, and detects a difference between a value of the sampling data determined as the zero level and a corresponding reference value.

5. A data reproduction apparatus comprising:
a data detector which detects data based on partial response maximum likelihood;
an equalizer comprising a digital filter;
a level error detector which extracts a level of an output value of the equalizer based on a reference level set in the data detector, and predetermines at least one reference value corresponding to a zero level, positive and negative middle levels, and positive and negative maximum levels, which are classified depending on the partial response (PR) type of the data detector, and detects the level of the output value of the equalizer, and outputs at least one level error corresponding to a difference between the detected level and a corresponding reference value; and
a coefficient adapter which adapts filter coefficients of the equalizer such that a difference between the level error and a target level error is minimized,
wherein the level error detector:
    determines whether the product of first and second successive sampling data output from the equalizer is less than or equal to 0;
    compares the absolute values of the first and second successive sampling data if the product of the first and second successive sampling data output from the equalizer is less than or equal to 0;
    determines the second successive sampling data and sampling data preceding the first and second successive sampling data to be the positive and negative middle levels if the absolute value of the second successive sampling data is greater than the absolute value of the first successive sampling data;
    determines the first successive sampling data and the sampling data following the first and second successive sampling data to be the positive and negative middle levels if the absolute value of the first successive sampling data is greater than or equal to the absolute value of the second successive sampling data; and
    detects level errors corresponding to respective differences between the values of the sampling data determined as the negative and positive middle levels and corresponding reference values.

6. The apparatus of claim 1, wherein:
the error detector determines the reference value to correspond to be the zero level where a product of the first sampling data and second sampling data among the successive sampling data is not less than zero.

7. The apparatus of claim 1, wherein:
where the error detector determines that a product of the first sampling data and second sampling data among the successive sampling data is less than zero, the error detector determines which of the first and second sampling data is less than zero and sets the sampling data which is less than zero as the negative middle level zero and the sampling data which is greater than zero as the positive middle level.

8. The apparatus of claim 1, wherein:
where the error detector determines that the first sampling data and second and third sampling data among the successive sampling data are all greater than a threshold value, the error detector sets the second sampling data as the positive maximum level.

9. The apparatus of claim 1, wherein:
where the error detector determines that the first sampling data and second and third sampling data among the successive sampling data are all less than a threshold value, the error detector sets the second sampling data as the negative maximum level.

* * * * *